United States Patent
Biberger et al.

(10) Patent No.: US 9,960,012 B2
(45) Date of Patent: May 1, 2018

(54) METHOD FOR STRUCTURING AN OBJECT AND ASSOCIATED PARTICLE BEAM SYSTEM

(71) Applicant: Carl Zeiss Microscopy GmbH, Jena (DE)

(72) Inventors: Josef Biberger, Wildenberg (DE); Roland Salzer, Leipzig (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days. days.

(21) Appl. No.: 15/451,655

(22) Filed: Mar. 7, 2017

(65) Prior Publication Data

US 2017/0263416 A1 Sep. 14, 2017

(30) Foreign Application Priority Data

Mar. 9, 2016 (DE) .................... 10 2016 002 883

(51) Int. Cl.
*H01J 37/304* (2006.01)
*H01J 37/317* (2006.01)
(Continued)

(52) U.S. Cl.
CPC .......... *H01J 37/3045* (2013.01); *H01J 37/26* (2013.01); *H01J 37/28* (2013.01); *H01J 37/3177* (2013.01);
(Continued)

(58) Field of Classification Search
USPC ......................................... 250/306, 307, 311
See application file for complete search history.

(56) References Cited

U.S. PATENT DOCUMENTS

| | | | |
|---|---|---|---|
| 6,855,938 B2 | 2/2005 | Preikszas et al. | |
| 9,633,819 B2 * | 4/2017 | Phaneuf | ................ H01J 37/222 |

(Continued)

FOREIGN PATENT DOCUMENTS

| | | |
|---|---|---|
| JP | H01-184824 A | 7/1989 |
| JP | 2012-022903 A | 2/2012 |

OTHER PUBLICATIONS

German Office Action, with translation thereof, for corresponding DE application No. 10 2016 002 883.1 dated Jun. 22, 2016.
(Continued)

*Primary Examiner* — Kiet T Nguyen
(74) *Attorney, Agent, or Firm* — Fish & Richardson P.C.

(57) ABSTRACT

A includes arranging a substrate in a working region of a first particle beam column and a second particle beam column; producing a desired target structure on the substrate by directing a first particle beam generated by the first particle beam column at a multiplicity of sites of the substrate to deposit material thereon or to remove material therefrom; repeatedly interrupting the production of the desired target structure and producing a marking on the substrate by directing the first particle beam onto the substrate and continuing the production of the desired target structure; and capturing positions of the markings on the substrate by directing a second particle beam produced by the second particle beam column onto the markings on the substrate, and detecting particles or radiation which are produced in the process by the second particle beam on the substrate.

20 Claims, 2 Drawing Sheets

(51) Int. Cl.
*H01J 37/26* (2006.01)
*H01J 37/28* (2006.01)

(52) U.S. Cl.
CPC ........... *H01J 2237/31732* (2013.01); *H01J 2237/31745* (2013.01); *H01J 2237/31749* (2013.01); *H01J 2237/31798* (2013.01)

(56) References Cited

U.S. PATENT DOCUMENTS

| | | |
|---|---|---|
| 2009/0218488 A1 | 9/2009 | Wells |
| 2010/0008563 A1 | 1/2010 | Fujii et al. |
| 2013/0319849 A1 | 12/2013 | Fuller et al. |
| 2013/0344292 A1 | 12/2013 | Bugge et al. |
| 2014/0291512 A1 | 10/2014 | Nakatani et al. |
| 2017/0140897 A1* | 5/2017 | Phaneuf .............. H01J 37/3056 |

OTHER PUBLICATIONS

R. Wirth, "Focused Ion Beam (FIB) combined with SEM and TEM: Advanced analytical tools for studies of chemical composition, microstructure and crystal structure in geomaterials on a nanometre scale", Chemical Geology, Elsevier, vol. 261, 2009, pp. 217-229.
Dutch search report, with translation thereof, for corresponding NL application No. 2018477 dated Jul. 28, 2017.

* cited by examiner

2

METHOD FOR STRUCTURING AN OBJECT AND ASSOCIATED PARTICLE BEAM SYSTEM

CROSS-REFERENCE TO RELATED APPLICATION

This application claims benefit under 35 U.S.C. § 119 to German Application No. 10 2016 002 883.1, filed Mar. 9, 2016. The contents of this application is hereby incorporated by reference in its entirety.

FIELD

The disclosure relates to a method for structuring an object using a particle beam system, which includes two particle beam columns, for example an ion beam column and an electron beam column, and to an associated particle beam system.

BACKGROUND

A particle beam system, which includes two particle beam columns, the particle beams of which can be directed onto a common working region on an object, is traditionally used for structuring the object. Here, a particle beam, for example an ion beam or an electron beam, is used to form the structures on the object, while the other particle beam, for example an electron beam of an electron beam microscope, is used to monitor the process of structuring the object. The object is structured by way of depositing material on the object or by removing material from the object by way of directing the particle beam used for this purpose at a multiplicity of sites of the object. Depositing of material on the object and removing material from the object can be assisted by way of supplying a process gas. One example of a process in which an ion beam is used for structuring an object is the production of what is known as a TEM lamella, i.e. cutting a sample suitable for examination with a transmission electron microscope out of a substrate, such as for example a semiconductor wafer in production.

Such processes for structuring an object using a particle beam can take a few minutes, a few tens of minutes or even hours. During this time, drifts with respect to the sites at which the particle beam is incident on the object may occur, which influence the accuracy and reproducibility of the manufactured structures in a disadvantageous manner.

The drifts can also be caused by temperature changes or changes in the high voltage used during the operation of the particle beam column or the like.

Even if the process of structuring the object using a particle beam column is monitored by the other particle beam column and the process of structuring is performed in dependence on this monitoring, it is not possible to achieve the highest possible precision, because the locations of the two particle beam columns relative to one another is also subject to mechanical drift, and not all structures which are produced using the one particle beam column can be observed in optimum fashion by the other particle beam column because the particle beams which are generated by the two particle beam columns are incident on the object at different angles.

SUMMARY

The present disclosure proposes a method for structuring an object which permits greater precision.

Embodiments of the disclosure propose a method for structuring an object by way of a particle beam system, which includes two particle beam columns, wherein one particle beam column is used to produce a desired target structure by depositing material or removing material and to repeatedly produce a marking on the substrate while the desired target structure is being produced, and the other particle beam column is used to capture the position of a newly produced marking and/or the positions of previously produced markings. Based on these captured positions, it is then possible to perform the further production of the desired target structure.

Since the markings are produced using the same particle beam with which the desired target structure is produced, it is possible, during the possibly prolonged process of producing the desired target structure, to detect and correct drifts which occur in this particle beam column. A drift in the particle beam column used for observation or a drift in the mechanical positioning of the two particle beam columns relative to one another negatively impacts this method only to a small degree, because the positions of the markings can be captured very quickly and the positions thereof relative to one another can be precisely determined independently of such drifts.

According to embodiments of the disclosure, a method for structuring an object includes: arranging a substrate in a working region of a first particle beam column and a second particle beam column; producing a desired target structure on the substrate by directing a first particle beam generated by the first particle beam column at a multiplicity of sites of the substrate to deposit material thereon or to remove material therefrom; repeatedly interrupting the production of the desired target structure and producing a marking on the substrate by directing the first particle beam onto the substrate and continuing the production of the desired target structure; and capturing positions of the markings on the substrate by directing a second particle beam produced by the second particle beam column onto the markings on the substrate, and detecting particles or radiation which are produced in the process by the second particle beam on the substrate; wherein beam deflections of the first particle beam which are to be produced by the first particle beam column are determined in dependence on the captured positions of the markings such that the first particle beam is directed onto the multiplicity of sites of the substrate.

Depositing material on the object or removing material from the object takes place at any one time at the site of the substrate onto which the first particle beam is being directed. These sites and their temporal succession are given by the geometry of the desired target structure and can be fixed in advance, for example. In order to strike a desired site on the substrate, the first particle beam is suitably deflected by the first particle beam column. The particle beam can here reside at any desired site for a specific time period and quickly move or jump from each desired site to the next desired site. The particle beam can furthermore be moved over the desired sites by continuous deflection. By way of example, a controller of the particle beam column can include a table or a calculation rule which establishes a relationship between coordinates of sites of the substrate and beam deflections which must be produced to direct the first particle beam to the relevant sites. The beam deflections can here be represented for example by control voltages or control currents or other control signals that are fed to beam deflectors of the first particle beam column. A drift occurring in the first particle beam column or the positioning of the substrate relative to the first particle beam column makes it desirable to the correct beam deflections, which are to be produced so that the first particle beam is incident on the desired sites of the object, in order to compensate for the drift. Such corrections of already determined desired beam deflections or directly determined beam deflections can be determined by taking into account the captured positions of the markings to compensate drifts, for example.

According to exemplary embodiments, the desired target structure has a three-dimensional structure. That means that the target structure does not extend merely two-dimensionally in a surface but in three-dimensional space. According to exemplary embodiments, the desired target structure herein has two surface regions, the surface normals of which have orientations which differ by more than 5°, in particular by more than 10° and in particular by more than 15°.

According to exemplary embodiments, the method furthermore includes producing a marking on the substrate before the start of the production of the desired target structure. Drifts which occur between the start of the production of the desired target structure and the first interruption of the production of the desired target structure and the production of the marking on the substrate can hereby be captured.

According to exemplary embodiments, the markings are produced in a surface region of the substrate in neighboring fashion, wherein orientations of surface normals of this surface region differ by less than 5°, in particular less than 1° and in particular less than 0.1°. That means that the markings on the substrate as a whole have a two-dimensional structure, with the result that distances between individual markings and thus their positions can be determined using the second particle beam with relatively great accuracy, even if the beam is incident on the substrate at an angle that differs from the angle at which the first particle beam is incident on the substrate.

According to exemplary embodiments, the method furthermore includes depositing a metallic layer in a surface region of the substrate, wherein the markings are produced in the metallic layer. An in particular thin metallic layer can be removed quickly by the first particle beam to produce such markings, which then provides great contrast during the capturing of the position thereof using the second particle beam column.

According to exemplary embodiments, the markings each include one straight line or two intersecting straight lines. It is thus possible to simply capture distances between different markings by way of scanning them with the second particle beam.

According to exemplary embodiments, a main axis of the first particle beam device and a main axis of the second particle beam device are oriented with respect to one another by more than 10°, in particular more than 20°, and in particular more than 30°. The first particle beam can be an ion beam, in particular a gallium ion beam, and the second particle beam can be an electron beam, wherein the second particle beam column can be the particle beam column of an electron microscope.

According to exemplary embodiments, the method furthermore includes capturing an instantaneous shape of the target structure being produced by way of directing the second particle beam onto a region of the substrate in which the target structure is being produced, and detecting particles or radiation which are produced in the process by the second particle beam on the substrate, wherein the beam deflections of the first particle beam, which are to be produced by the first particle beam column and are such that the first particle beam is directed onto the multiplicity of sites of the substrate, are furthermore determined in dependence on the captured instantaneous shape of the target structure being produced.

It is thus possible to monitor the formation of the desired target structure and to compensate, for example, for drifts in the rate at which the material is deposited on the substrate or in the rate at which material is removed from the substrate, which can be caused for example by a change in the beam current of the first particle beam or a change in the pressure of a process gas used.

BRIEF DESCRIPTION OF THE DRAWINGS

Embodiments of the disclosure are explained below on the basis of figures, in which.

DETAILED DESCRIPTION

Figure 1:
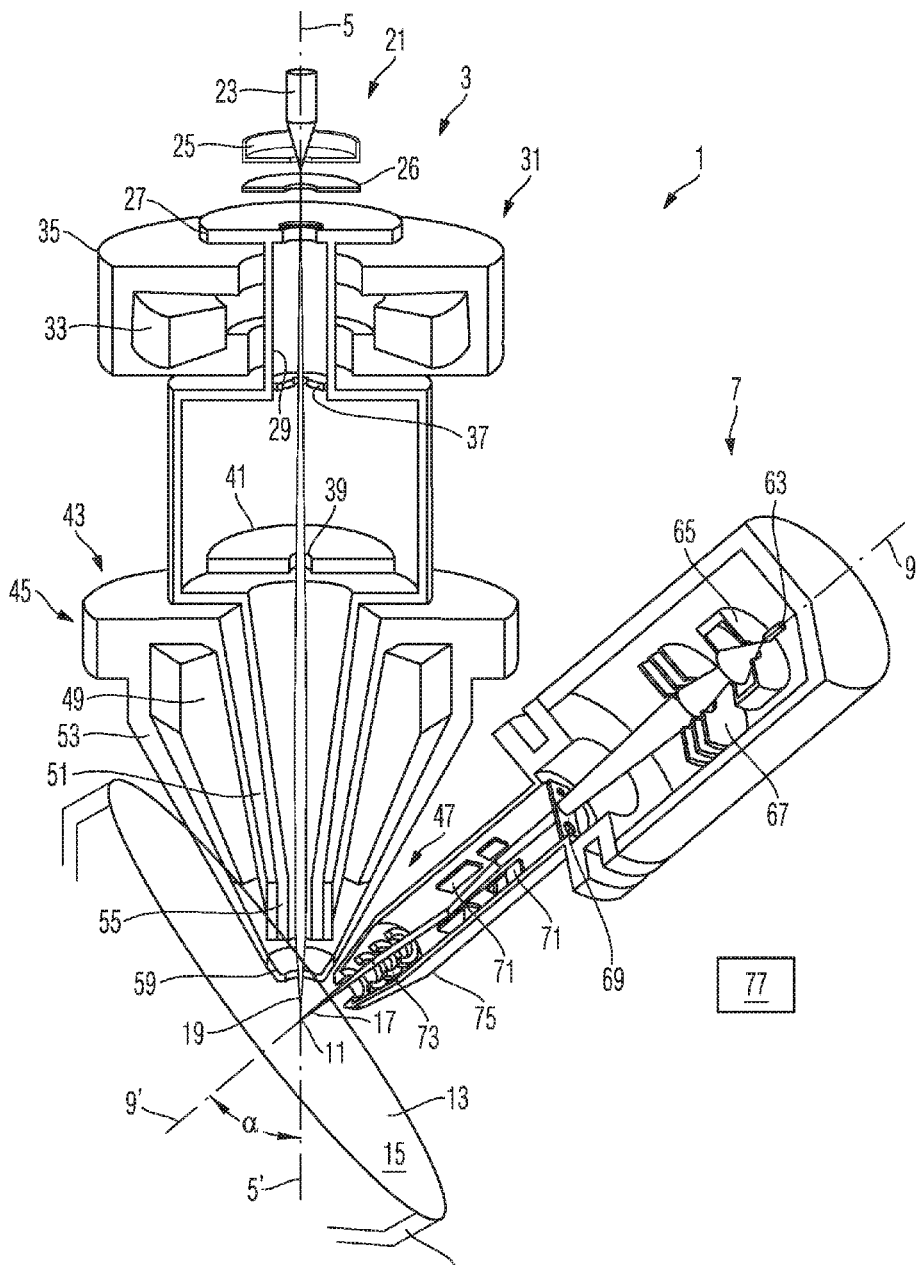
FIG. 1 shows a particle beam system having two particle beam columns.

In a perspective and schematically simplified illustration, FIG. 1 shows a particle beam system 1 having two particle beam columns, wherein a first particle beam column 7 is the particle beam column of an ion beam system having a main axis 9, and a second particle beam column 3 is the particle beam column of an electron microscopy system having a main axis 5.

The main axes 5 and 9 of the electron microscopy system 3 or of the ion beam system 7 intersect at a site 11 within a shared working region of the two particle beam columns 3, 7 at an angle α, which can have a value of for example 45° to 55°, with result that an object 13 to be structured having a surface 15 can both be processed in a region of the site 11 using an ion beam 17 which is emitted along the main axis 9 of the ion beam system 7 and be examined using an electron beam 19 which is emitted along the main axis 5 of the electron microscopy system 3. For holding the object, a schematically indicated holder 16 is provided, which can adjust the object 13 with respect to its distance from and orientation with respect to the electron microscopy system or the ion beam system.

To this end, the electron microscopy system 3 includes, for producing the primary electron beam 19, an electron source 21, which is illustrated schematically by way of a cathode 23 and an anode 27 and a suppressor electrode 25, which is arranged between the two, and an extractor electrode 26, which is arranged at a distance therefrom. The electron microscopy system 3 furthermore includes an acceleration electrode 27 which transitions into a beam tube 29 and runs through a collimator arrangement 31, which is illustrated schematically by way of a toroidal coil 33 and a yoke 35. After the primary electron beam has passed through the collimator arrangement 31, it runs through a pinhole aperture 37 and a central hole 39 in a secondary electron detector 41, whereupon the primary electron beam 19 enters an objective lens 43 of the electron microscopy system 3. The objective lens 43 includes a magnetic lens 45 and an electrostatic lens 47 for focusing the primary electron beam 19. In the schematic illustration of FIG. 1, the magnetic lens 45 includes a toroidal coil 49, an internal pole piece 51 and an external pole piece 53. The electrostatic lens 47 is formed by a lower end 55 of the beam tube 29, the internal lower end of the external pole piece 53, and a toroidal electrode 59 which tapers conically towards the position 11 on the sample. The objective lens 43, which is schematically illustrated in FIG. 1, can have a construction as is illustrated in more detail in U.S. Pat. No. 6,855,938.

The ion beam system 7 includes an ion source 63 having an extraction electrode 65, a collimator 67, a stop 69, deflection electrodes 71 and focusing lenses 73 for producing the ion beam 17 which exits a housing 75 of the ion beam system 7. The longitudinal axis 9' of the holder 16 is inclined with respect to the vertical 5' by an angle which in this example corresponds to the angle α between the directions 5 and 9 of the particle beams. However, the directions 5' and 9' do not need to coincide with the directions 5 and 9 of the particle beams, and the angle they enclose does not have to match the angle α between the particle beams.

The particle beam system 1 furthermore includes a controller 77, which controls the operation of the particle beam system 1. The controller 77 in particular controls switching the electron beam 19 and the ion beam 17 and beam deflectors 71 of the ion beam column 7 and beam deflectors (not illustrated in FIG. 1) of the electron beam column 3 on and off in order to deflect the particle beams relative to the main axes 9, 5 of the ion beam column 7 or the electron beam column 3 in order to direct the beams onto selectable sites within the shared working region on the object 13. The controller is programmable and can perform a method for structuring the object 13, as explained below with reference to FIG. 2.

The object 13 is, for example, a semiconductor substrate, in which structures are provided during the production by way of lithographic steps, which structures form components of electronic circuits. It is assumed that these structures are to be examined using a transmission electron microscope. For this purpose it is desirable to take a material sample at a desired location of the substrate, which material sample is suitable for examination using a transmission electron microscope. Such a sample, which is also referred to as a TEM lamella, is prepared by way of cutting a thin, cuboid plate having a thickness of for example 100 nm or less out of the volume of the substrate and subsequently making it even thinner by removing material at the flat sides of the plate, for example using a further particle beam. The working steps for this purpose, which substantially include removing material of the substrate 13, are performed by way of ion beam etching, in which the ion beam 17 which is produced by the ion beam column 7 is directed at selectable sites of the substrate 13 such that the thin plate 81 is cut free from the substrate 13. A micromanipulator can then be used to remove the thin plate 81 from the substrate, to supply it to further working steps, and finally to attach it to a sample holder of the transmission electron microscope.

Figure 2:
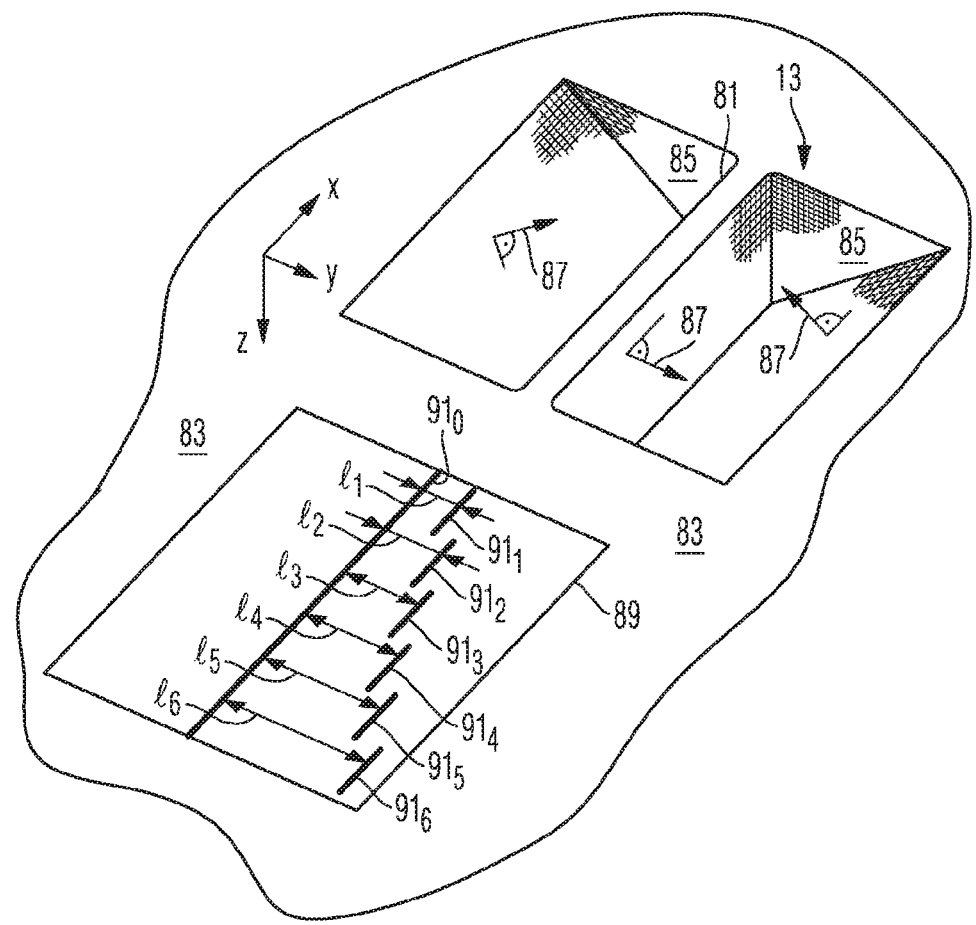
FIG. 2 shows a state of a substrate during the production of a desired target structure on the substrate for illustrating an embodiment of a method for structuring an object.

FIG. 2 shows an intermediate stage during the cutting of the thin plate 81 out of the substrate 13 using the ion beam 17. The thin plate 81 is, in this intermediate stage, partially cut free, starting from a surface 83 of the substrate 13 on both sides of the thin plate 81, by producing trenches 85 by removing material of the substrate 13 using the ion beam 17. In the intermediate stage shown in FIG. 2, the thin plate 81 is still connected by its ends and the bottom of the trenches 85 to the rest of the substrate 13. These material connections can be later severed using the ion beam, with the result that the thin plate 81 is cut completely free and can be grasped by the micromanipulator and be removed from the substrate 13. In the intermediate stage shown in FIG. 2, the trenches 85 and the thin plate 81, which is located between them and is connected by its front ends and the bottom of the trenches to the substrate 13, form a desired target structure in the method for structuring the object 13. This target structure has a three-dimensional extent, in that the extent of the thin plate 81 in an x-direction is for example 10 μm, the depth of the trenches 85 in a z-direction is for example 5 μm, and each of the trenches 85 at the surface 83 of the substrate 13 in a y-direction has a width of for example 8 μm. The three-dimensional structure of the target structure can also be seen by the fact that normal vectors 87 at surfaces of the target structure, such as at the walls of the trenches 85 and the surfaces of the thin plate 81 relative to one another, enclose angles of more than 5°, in particular more than 10°, and in particular more than 15°.

The production of the desired target structure shown in FIG. 2 by removing material of the substrate 13 by way of the ion beam takes a significant amount of time, such as for example 30 minutes. Since the thickness of the thin plate 81 is very small, for example 100 nm or less, it must be ensured that the ion beam can be directed onto the planned sites on the substrate with a corresponding accuracy, so as not to accidentally remove material from the thin plate 81 and to thereby render it unusable, for example. Drifts which inevitably occur during the operation of the ion beam column 7 and the holder holding the substrate 13 relative to the ion beam column 7 make it more difficult to maintain this precision. For example, such drifts which inevitably occur can change the site of the incidence of the ion beam on the object by 100 nm in a time period of 5 minutes.

For this reason, the method for structuring the substrate 13 envisions that the process for producing the desired target structure is repeatedly interrupted and markings are produced using the ion beam 17 in a surface region 89 next to the target structure. These markings are then examined using the electron beam microscope 3, for example by the electron beam microscope 3 obtaining an electron-microscopic image of the surface region 89. From this electron-microscopic image, positions of the markings relative to one another can be captured, and the further process of producing the desired target structure can then be controlled on the basis of the captured positions of the markings.

Before the process for producing the desired target structure begins, a thin metallization layer can be deposited in the surface region 89 on the surface 83 of the substrate 13. The disposition of the metal for the metallization layer in the surface region 89 can in turn be produced by the ion beam 17 by the latter being systematically directed onto sites within the surface region 89 with simultaneous supply of a suitable process gas. The process gas can be, for example, $C_9H_{16}Pt$, which is excited by the ion beam and at the instantaneous site of incidence of the ion beam on the substrate 13 results in the deposition of the metal platinum (Pt). The thickness of this metallization layer can be, for example, 50 nm.

Once the metallization layer in the surface region 89 is finished, the metallization layer is provided with a first marking $91_0$, which has the shape of an extended line running in the x-direction. The marking $91_0$ is produced using the ion beam.

Subsequently, the process for producing the desired target structure on the substrate 13 is started. After a time period of for example 2 minutes, which is short as compared to the total duration of the process for producing the desired target structure, the process for producing the desired target structure is interrupted, and a marking $91_1$ is produced in the surface region 89 using the ion beam, which marking in the example shown in FIG. 2 is a short line extending in the x-direction, which has a distance 11 from the marking $91_0$. At this point, the two markings $91_0$ and $91_1$ are provided in the surface region 89. Using the electron microscope 3, an electron-microscopic image of the surface region 89 is subsequently obtained, and the positions of the two markings $91_0$ and $91_1$ in the image are determined. In particular, the actual distance 11 in the y-direction between the two markings $91_0$ and $91_1$ can be determined. This distance is determined in the coordinate system of the electron beam microscope 3. The markings $91_0$ and $91_1$ were produced, however, by deflecting the ion beam in the coordinate system of the ion beam column 7. By evaluating the electron-microscopic image it is thus possible to examine the positions of the markings $91_0$ and $91_1$ relative to one another using a system which is independent of the system with which the markings were produced. If the measured distance 11 of the two markings $91_0$ and $91_1$ from one another is different from a desired distance which is obtained from the beam deflections of the ion beam 17 during the formation of the markings, the deflections of the ion beam 17, which are used in the further process of producing the desired target structure, can be corrected accordingly.

During the evaluation of the electron-microscopic image, only those locations of the markings relative to one another are evaluated, but not the locations of the markings relative to a relevant reference point in the image, such as for example the respective centre point of the electron-microscopic images. Since drifts within the electron beam microscope affect only the locations of fixed reference points, such as for example the centre points, but do not result in an undetermined change in the magnification of the electron-microscopic image, it is possible by evaluating the relative positions of the markings to reliably ascertain drifts in the ion beam column, which occur within the electron-microscopic image, without the measurement values thus ascertained being falsified by drifts of the electron beam microscope.

Taking into account such a correction, the method for producing the desired target structure is then continued by removing further material in the region of the trenches 85 from the substrate using the ion beam 17. After, for example, a further 2 minutes, the process of producing the desired target structure is interrupted again, and a further marking $91_2$ is provided in the surface region 89, which marking is similar to the marking $91_1$ and extends in the form of a short line in the x-direction, but has a distance 12 from the marking $91_0$. Once again, an electron-microscopic image of the surface region 89 is obtained, from which the positions of the markings $91_0$ and $91_2$ are determined, wherein a current correction for beam deflections of the ion beam for the further process of producing the desired target structure can be obtained from the distance 12 between the marking $91_2$, which was provided last, and the marking $91_0$, which was provided first. This process of producing the desired target structure is then continued and again interrupted several times to in each case provide a new marking in the surface region 89 and to determine from their positions a now updated correction for deflections of the ion beam in the further process.

In the intermediate stage shown in FIG. 2, further markings $91_3$, $91_4$, $91_5$ and $91_6$ were provided in the surface region 89, with the marking $91_6$ being the marking which was provided last.

Figure 3:
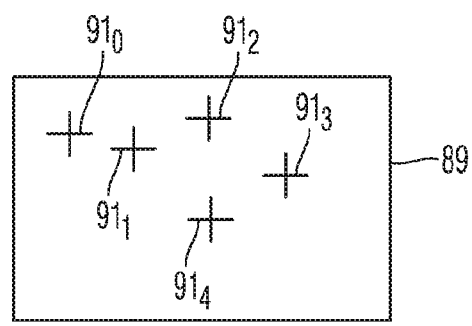
FIG. 3 shows an arrangement of markings which can be employed in an embodiment of the method for structuring the object.

In FIG. 2, the desired target structure to be produced is the thin plate 81, which is intended to later become TEM lamella and which extends in the x-direction, while it is intended to be very thin in the y-direction. For this reason it is in particular important to be able to effect the positioning of the ion beam in the y-direction with great accuracy. For this reason, the markings $91_0$, $91_1$, ..., are each straight lines extending in the x-direction, with the result that the positions of the markings relative to one another in the y-direction can be determined with great accuracy. However, it is possible to use different shapes of markings. One example of this is shown in FIG. 3, where the shape of each marking is that of a cross, which makes it easier to determine positions of the markings relative to one another in two independent directions (x, y). Other shapes can be used for marking.

In the example explained with reference to FIG. 2, the distance 11, 12, ..., at which markings $91_1$, $91_2$, ..., are provided from the marking $91_0$ that was provided first, increases uniformly. However, this is not necessary. During every interruption of the process for producing the desired target structure, the newly produced marking can in principle be produced at any desired point of the surface region 89, as long as it is ensured that the marking which was provided last is identifiable among the existing markings.

In the previously mentioned exemplary embodiments, the two trenches 85 are simultaneously produced on both sides of the plate 81 in the sense that they are produced in multiple cycles, with each cycle including the removal of material from each of the two trenches and the provision of a further marking 91. However, the two trenches can also be produced one after the other by first producing one trench by removing material from the trench in each of multiple cycles and producing a further marking until the first trench is substantially completely produced, whereupon the second trench is produced in the same manner. Here, two separate metallization layers which are physically apart from one another can be provided, with each metallization layer being assigned a trench, during the production of which markings are provided in the metallization layer.

What is claimed is:

1. A method, comprising:
    arranging a substrate in a working region of a first particle beam column and a second particle beam column;
    producing a desired target structure on the substrate by directing a first particle beam generated by the first particle beam column at a multiplicity of sites of the substrate to deposit material thereon or to remove material therefrom;
    repeatedly performing a sequence which comprises:
        interrupting the production of the desired target structure;
        after interrupting the production, producing a marking on the substrate by directing the first particle beam onto the substrate; and
        after producing the marking, continuing the production of the desired target structure; and
    continuing the production of the desired target structure comprises:
        capturing positions of at least two of the markings on the substrate by directing a second particle beam produced by the second particle beam column onto the at least two of the markings on the substrate, and detecting particles or radiation which are produced in the process by the second particle beam on the substrate; and
        determining beam deflections of the first particle beam which are to be produced by the first particle beam column in dependence on the captured positions of the at least two of the markings such that the first particle beam is directed onto the multiplicity of sites of the substrate.

2. The method of claim 1, wherein the desired target structure has two surface regions, the surface normals of which have orientations which differ by more than 5°.

3. The method of claim 1, wherein the desired target structure has two surface regions, the surface normals of which have orientations which differ by more than 10°.

4. The method of claim 1, wherein the desired target structure has two surface regions, the surface normals of which have orientations which differ by more than 15°.

5. The method of claim 1, further comprising, before starting to produce the desired target structure, producing a marking on the substrate.

6. The method of claim 1, wherein the markings are produced in a surface region of the substrate in neighboring fashion, and orientations of surface normals of the surface region differ by less than 5°.

7. The method of claim 1, wherein the markings are produced in a surface region of the substrate in neighboring fashion, and orientations of surface normals of the surface region differ by less than 1°.

8. The method of claim 1, wherein the markings are produced in a surface region of the substrate in neighboring fashion, and orientations of surface normals of the surface region differ by less than 0.1°.

9. The method of claim 1, further comprising depositing a metallic layer in a surface region of the substrate, wherein the markings are produced in the metallic layer.

10. The method of claim 1, wherein the markings each include one straight line or two intersecting straight lines.

11. The method of claim 1, wherein a main axis of the first particle beam column and a main axis of the second particle beam column are oriented with respect to one another by an angle of more than 10°.

12. The method of claim 1, wherein a main axis of the first particle beam column and a main axis of the second particle beam column are oriented with respect to one another by an angle of more than 20°.

13. The method of claim 1, wherein a main axis of the first particle beam column and a main axis of the second particle beam column are oriented with respect to one another by an angle of more than 30°.

14. The method of claim 1, wherein capturing of positions of the markings on the substrate comprises determining a distance of at least a pair of markings from one another.

15. The method of claim 1, further comprising capturing an instantaneous shape of the target structure being produced by way of directing the second particle beam onto a region of the substrate in which the target structure is being produced, and detecting particles or radiation which are produced in the process by the second particle beam on the substrate,
wherein the beam deflections of the first particle beam, which are to be produced by the first particle beam column and are such that the first particle beam is directed onto the multiplicity of sites of the substrate, are furthermore determined in dependence on the captured instantaneous shape of the target structure being produced.

16. The method of claim 1, wherein the first particle beam produced by the first particle beam column is an ion beam, in particular a gallium ion beam, and the second particle beam produced by the second particle beam column is an electron beam.

17. The method of claim 1, wherein the method produces a structured TEM lamella.

18. A particle beam system, comprising:
a first particle beam column;
a second particle beam column; and
a controller configured to control the particle beam system so that, during use of the particle beam system, the particle beam system:
produces a desired target structure on the substrate by directing a first particle beam generated by the first particle beam column at a multiplicity of sites of the substrate to deposit material thereon or to remove material therefrom;
repeatedly performs a sequence which comprises:
interrupting the production of the desired target structure;
after interrupting the production; producing a marking on the substrate by directing the first particle beam onto the substrate; and
after producing the marking, continuing the production of the desired target structure; and
continuing the production of the desired target structure comprises:
capturing positions of at least two of the markings on the substrate by directing a second particle beam produced by the second particle beam column onto the markings on the substrate, and detecting particles or radiation which are produced in the process by the second particle beam on the substrate; and
determining, in dependence on the captured positions of the at least two of the markings, beam deflections of the first particle beam which are to be produced by the first particle beam column such that the first particle beam is directed onto the multiplicity of sites of the substrate.

19. A method, comprising:
producing a target structure on a substrate by directing a first particle beam generated by a first particle beam column at a multiplicity of sites of the substrate to deposit material thereon or to remove material therefrom;
repeatedly performing a sequence which comprises:
interrupting the production of the target structure
after interrupting the production, producing a marking on the substrate by directing the first particle beam onto the substrate; and
after producing the marking, continuing the production of the target structure; and
continuing the production of the desired target structure comprises:
capturing positions of at least two of the markings on the substrate by directing a second particle beam produced by a second particle beam column onto the markings on the substrate, and detecting particles or radiation which are produced in the process by the second particle beam on the substrate; and
determining, in dependence on the captured positions of the at least two of the markings, beam deflections of the first particle beam which are to be produced by the first particle beam column such that the first particle beam is directed onto the multiplicity of sites of the substrate.

20. A method, comprising:
a) directing a first particle beam generated by a first particle beam column at a multiplicity of sites of a substrate to deposit material thereon or to remove material therefrom to produce a target structure on the substrate;

b) at least one time performing a sequence which comprises:
- interrupting a) to produce a marking on the substrate by directing the first particle beam onto the substrate and continuing the production of the target structure;
- capturing positions of at least two of the markings on the substrate by directing a second particle beam produced by a second particle beam column onto the markings on the substrate, and detecting particles or radiation which are produced in the process by the second particle beam on the substrate; and
- determining, in dependence on the captured positions of the at least two of the markings, beam deflections of the first particle beam which are to be produced by the first particle beam column such that the first particle beam is directed onto the multiplicity of sites of the substrate.

\* \* \* \* \*